(12) United States Patent
Kalish et al.

(10) Patent No.: US 9,117,737 B2
(45) Date of Patent: Aug. 25, 2015

(54) MOLYBDENUM TRIOXIDE-COATED HYDROGEN-TERMINATED DIAMOND SURFACE AND USES THEREOF

(71) Applicant: Technion Research and Development Foundation Ltd., Technion, Haifa (IL)

(72) Inventors: Rafi Kalish, Haifa (IL); Moshe Tordjman, Haifa (IL)

(73) Assignee: TECHNION RESEARCH AND DEVELOPMENT FOUNDATION LTD., Technion (IL)

( * ) Notice: Subject to any disclaimer, the term of this patent is extended or adjusted under 35 U.S.C. 154(b) by 0 days.

(21) Appl. No.: 14/261,364

(22) Filed: Apr. 24, 2014

(65) Prior Publication Data

US 2014/0319542 A1    Oct. 30, 2014

(30) Foreign Application Priority Data

Apr. 25, 2013  (IL) .......................................... 225976

(51) Int. Cl.
| | | |
|---|---|---|
| *H01L 21/00* | (2006.01) | |
| *H01L 29/16* | (2006.01) | |
| *H01B 1/04* | (2006.01) | |
| *H01L 29/267* | (2006.01) | |

(52) U.S. Cl.
CPC .............. *H01L 29/1602* (2013.01); *H01B 1/04* (2013.01); *H01L 29/267* (2013.01); *Y10T 428/265* (2015.01); *Y10T 428/30* (2015.01)

(58) Field of Classification Search
CPC ............ H01L 21/045; H01L 21/02126; H01L 21/28194; H01L 27/1104; H01L 29/0852; H01L 29/6603; H01L 29/66045; H01L 29/1602; H01L 29/7817; H01L 29/7869
USPC ........... 438/105, 91, 197, 141, 502, 509, 510, 438/570, 475, 680, 931; 257/77, 104, 288
See application file for complete search history.

(56) References Cited

U.S. PATENT DOCUMENTS

| | | | | |
|---|---|---|---|---|
| 5,463,271 | A * | 10/1995 | Geis et al. ................. | 313/346 R |
| 5,489,817 | A * | 2/1996 | Muller et al. ................ | 313/495 |
| 6,091,186 | A * | 7/2000 | Cao et al. ...................... | 313/310 |
| 7,138,170 | B2 * | 11/2006 | Bourdelais et al. ........... | 428/188 |
| 8,142,913 | B2 * | 3/2012 | Goela et al. .................. | 428/702 |

FOREIGN PATENT DOCUMENTS

| | | |
|---|---|---|
| EP | 0827208 A2 | 3/1998 |
| WO | 2011/139236 A1 | 10/2011 |

OTHER PUBLICATIONS

Vardi et al., "A Diamond:H/MoO3 MOSFET," IEEE Electron Device Letters, vol. 35, No. 12, pp. 1320-1322, Dec. 2014.
(Continued)

*Primary Examiner* — David Nhu
(74) *Attorney, Agent, or Firm* — Knobbe, Martens, Olson & Bear, LLP

(57) ABSTRACT

A conducting material includes a carbon-based material selected from a diamond or an insulating diamond-like carbon, having a hydrogen-terminated surface and a layer of $MoO_3$ coating the surface. A method for the fabrication of such a material. The conducting material is useful in the fabrication of electronic components, electrodes, sensors, diodes, field effect transistors, and field emission electron sources.

21 Claims, 8 Drawing Sheets

(56) References Cited

OTHER PUBLICATIONS

Bolker et al., "Two-dimensional and zero-dimensional quantization of transfer-doped diamond studied by low temperature scanning tunneling spectroscopy" Physical Review B 83, pp. 155434-155437. (2011).

Chakrapani et al., "Charge transfer equilibria between diamond and an aqueous oxygen electrochemical redox couple" Science 318, pp. 1424-1430. (2007).

Chen et al., "Surface transfer doping of semiconductors progress in surface" Progress in Surface Science 84, pp. 279-321. (2009).

Choi et al., "XPS study of as-prepared and reduced molybdenum oxides" Applied Surface Science 93, pp. 143-149. (1996).

Christiaens et al., "EDC-mediated DNA attachment to nanocrystalline CVD diamond films" Biosensors and Bioelectronics 22, pp. 170-177. (2006).

Dankerl et al., "Hydrophobic interaction and charge accumulation at the diamond-electrolyte interface" Physical Review Letters 106, pp. 19610-19614 .(2011).

Edmonds et al., "Surface band bending and electron affinity as a function of hole accumulation density in surface conducting diamond" Applied Physics Letters 98, pp. 102101-3 .(2011).

Geis "Diamond transistor performance and fabrication" Proceedings of the IEEE 79, pp. 670-676 .(1991).

Geisler et al., "Aging of hydrogenated and oxidized diamond" Advanced Materiels 22, pp. 398-402. (2010).

Isberg et al., "High carrier mobility in single-crystal plasma-deposited diamond" Science 297, pp. 1670-1672. (2002).

Kalish "Diamond as a unique high-tech electronic material: difficulties and prospects" Journal of Physics D: Applied Physics 40, pp. 6467-6478. (2007).

Laikhtman et al., "Interaction of water vapor with bare and hydrogenated diamond film surfaces" Surface Science 551, pp. 99-105. (2004).

Landstrass et al., "Resistivity of chemical vapor deposited diamond films" Applied Physics Letters 55, pp. 975-977. (1989).

Lud et al., "Chemical grafting of niphenyl self-assembled monolayers on ultrananocrystalline diamond" Journal of American Chemical Society 128, pp. 16884-16891. (2006).

Maier et al., "Origin of surface conductivity in diamond" Physical Review Letters 85, pp. 3472-3475. (2000).

Maier et al., "Electron affinity of plasma-hydrogenated and chemically oxidized diamond •100) surfaces" Physical Review B 64, pp. 165411-165416. (2001).

Poh et al., "Biosensing properties of diamond and carbon nanotubes" Langmuir 20, pp. 5484-5492. (2004).

Qi et al., "Surface transfer doping of diamond (100) by tetrafluoro-tetracyanoquinodimethane" Journal of the American Chemical Society 129, pp. 8084-8085. (2007).

Ristein et al., "Electrochemical Surface Transfer Doping—The mechanism behind the surface conductivity of hydrogen-terminated diamond" Journal of the Electrochemical Society 151, pp. E315-E321 .(2004).

Ristein "Surface transfer doping of diamond" Journal of Physics D: Applied Physics 39, pp. R71-R81.(2006).

Russell et al., "Hydrogen-terminated diamond field-effect transistors with cutoff frequency of 53 GHz" IEEE Electron Device Letters vol. 33, No. 10, pp. 1471-1473. (2012).

Russell et al., "Surface transfer doping of diamond by MoO3: A combined spectroscopic and Hall measurement study" Applied Physics Letters 113, pp. 202112-202114 (2013).

Sauerer et al., "Low temperature surface conductivity of hydrogenated diamond" Physica Status Solidi A-Applications and Materials Science 186, pp. 241-247 .(2001).

Strobel et al., "Surface transfer doping of diamond" Nature 430, pp. 439-441. (2004).

Strobel et al., "Surface conductivity induced by fullerenes on diamond: Passivation and thermal stability" Diamond and Related Materials 15, pp. 720-724. (2006).

Sussmann CVD Diamond for Electronic Devices, John Wiley & Sons, Chichester, (2009).

Taniuchi et al., "High-frequency performance of diamond field-effect transistor" IEEE Electron Device Letters vol. 22, No. 8, pp. 390-392. (2001).

Wort et al., "Diamond as an electronic material" materials today 11, 1-2, pp. 22-28. (2008).

Yang et al.,"DNA-modified nanocrystalline diamond thinfilms as stable, biologically active substrates" Nature materials vol. 1, pp. 253-257. (2002).

Yom-Tov et al., "Accurate carrier-type determination of nonhomogenously doped diamond" Journal of Applied Physics 108, pp. 043711-043715. (2010).

* cited by examiner

MOLYBDENUM TRIOXIDE-COATED HYDROGEN-TERMINATED DIAMOND SURFACE AND USES THEREOF

CROSS-REFERENCE TO RELATED APPLICATIONS

The present application claims the benefit of Israeli Patent Application No. 225976, filed Apr. 25, 2013, the entire content of which being herewith incorporated by reference as if fully disclosed herein.

TECHNICAL FIELD

The present invention relates to a conductive diamond surface, more particularly, to molybdenum trioxide ($MoO_3$)-coated hydrogen-terminated diamond surface showing thermal stability with superior sheet conductivity and hole carrier concentration, and to uses thereof.

BACKGROUND ART

The quest for robust electronic devices singles out diamond as a most favorable candidate, however its doping is still problematic. The unique p-type surface conductivity induced by air exposure of hydrogen terminated diamond discovered by Landstrass and Ravi in 1989 (Landstrass and Ravi, 1989), opened up exceptional applications of diamond-based devices, such as high-power high-frequency devices (Isberg et al., 2002; Taniuchi et al., 2001; Wort and Balmer, 2008), field effect transistors (Kasu et al., 2005; Russell et al., 2012), nanoscale planar doped electronic devices (Sussmann, 2009; Geisler and Hugel, 2010), electrochemical electrodes (Poh et al., 2004; Christiaens et al., 2006), and biological electrodes sensors (Yang et al., 2002; Lud et al., 2006; Dankerl et al., 2011).

The two dimensional (2D) high p-type surface conductivity of diamond is induced by exposing a hydrogen terminated diamond surfaces (diamond:H) to high work function adsorbate molecules, leading to the so-called transfer doping (TD) of the diamond near surface (Strobel et al., 2004; Chakrapani et al., 2007). As explained by the electrochemical TD model (Maier et al., 2000), electrons transfer from the diamond valence band maximum (VBM) to lowest unoccupied molecular orbital of the adsorbate layer, leaving behind a hole accumulation layer. This results in an upward band bending and in the formation of a two dimensional hole layer extending to only a couple of nanometers from the surface into the diamond, exhibiting 2D quantization (Bolker et al., 2011).

Several potentially suitable molecules with high electron affinity and high work function values, have been examined as possible candidates for the surface TD of diamond:H (Ristein and Riedel, 2004; Chen et al., 2009). The first, and most widely studied adsorbate molecule, which has yielded the highest areal hole density measured so far ($5\times10^{13}$ cm$^{-2}$), is the aqueous ($H_2O$) layer adsorbate (Sauerer et al., 2001). TD in this case is simply achieved by exposure of the diamond:H surface to humid air. However, the required water coverage is sensitive to environment humidity and, in particular, depends on temperature which results in gradual loss of $H_2O$ during warming up, until a complete desorption occurs at 300° C. (Laikhtman et al., 2004). Hence the thus obtained p-type conductive layer suffers from low controllability and lack of thermal stability.

It is most desirable to find a more stable substitute to water for efficient TD of diamond. Several adsorbate molecules fulfilling diamond:H TD conditions have been studied, including fullerenes ($C_{60}$), fluorinated Fullerenes $C_{60}F_x$ (x=18, 36, 48) (Strobel et al., 2006). Tetrafluoro-tetracyano-quinodimethane ($F_4$-TCNQ) (Qi et al., 2007) and, most recently, $MoO_3$ (Russell et al., 2013). The thermal stability of these has, however, either not been investigated or was found not to be stable at elevated temperatures. Furthermore, all cases studied so far have exhibited lower conductivity values than that of water transfer doped diamond. Hence the need to find a material for TD of diamond which does not suffer from the above limitations.

SUMMARY OF INVENTION

It has now been found, in accordance with the present invention, that the use of $MoO_3$, as an adsorbate layer for inducing TD of diamond:H, yields a p-type conductive surface layer in diamond:H, showing strong thermal stability up to at least 350° C. and over a period of several days, with electrical properties significantly superior to those induced by other adsorbate layers, in particular, areal hole densities varying from $7\times10^{13}$ to $1\times10^{14}$ cm$^2$ depending on $MoO_3$ surface coverage.

In one aspect, the present invention thus provides a conducting material comprising a carbon-based material selected from a diamond or insulating diamond-like carbon, having a hydrogen-terminated surface and a layer of $MoO_3$ coating said surface. In a particular such aspect, said carbon-based material is a diamond.

In other aspects, the present invention relates to an electronic component; an electrode; a sensor; a diode; a field effect transistor (FET); and a field emission electron source, each comprising a conducting material as defined above, more particularly, wherein the carbon-based material is a diamond.

In a further aspect, the present invention provides a method for $MoO_3$ deposition on a hydrogen-terminated surface of a carbon-based material selected from a diamond or insulating diamond-like carbon, said method comprising:
(i) introducing said carbon-based material having a hydrogen-terminated surface into a vacuum chamber;
(ii) heating said carbon-based material to a temperature in a range of 100° C. to 500° C., thereby removing hydrocarbon contaminants, desorbing water adsorbates from said carbon-based material and preparing surface conditions for optimal deposition;
(iii) exposing the hydrogen-terminated surface of said carbon-based material to $MoO_3$ vapors thereby depositing a layer of $MoO_3$ on the hydrogen-terminated surface of said carbon-based material; and
(iv) repeating steps (ii) and (iii) until a desired thickness of said $MoO_3$ layer is obtained.

DETAILED DESCRIPTION OF THE INVENTION

Figure 1:
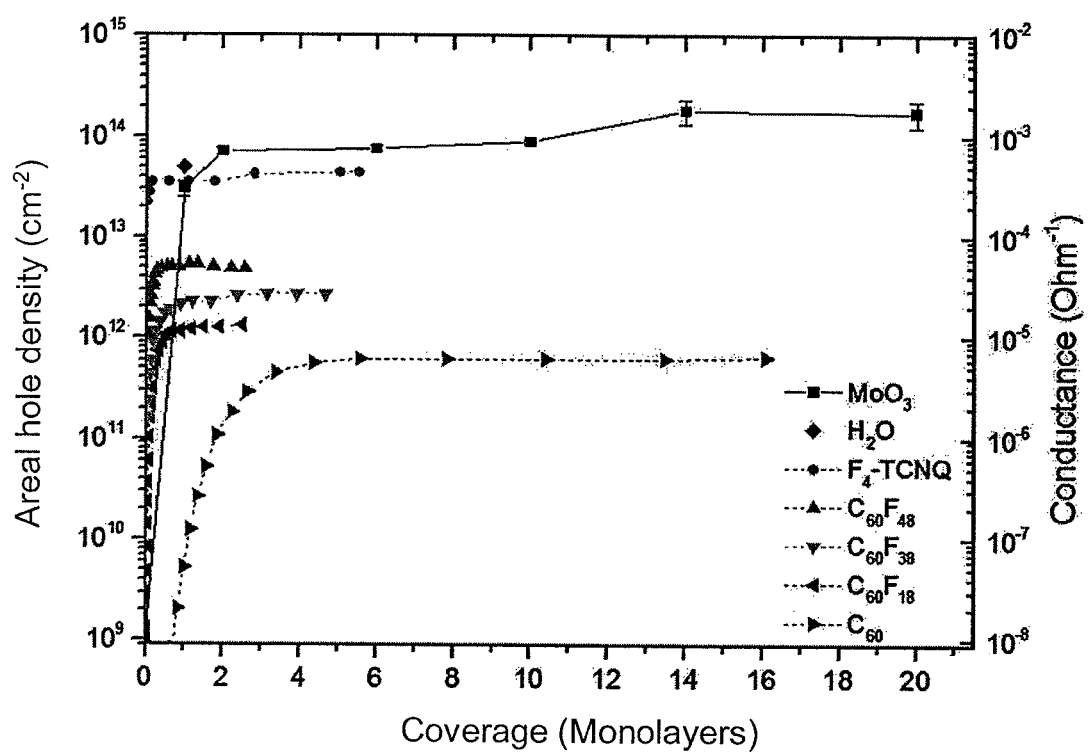
FIG. 1 shows areal hole carrier concentration (left axis) and sheet conductance (right axis) of transfer doped hydrogen terminated diamond sample with $MoO_3$, $H_2O$ (Sauerer et al., 2001), $F_4$-TCNQ as deduced from photoemission measurements (Qi et al., 2007) and $C_{60}F_x$ (x=0, 18, 38, 48) (Strobel et al., 2006) as a function of layer coverage. For the purpose of comparative representation, the sheet conductance was set proportionally to the areal hole density by adopting an average hole mobility value of 60 cm$^2$V$^{-1}$s$^{-1}$.

In one aspect, the present invention provides a conducting material comprising a carbon-based material selected from a diamond or insulating diamond-like carbon, having a hydrogen-terminated surface and a layer of MoO$_3$ coating said surface.

The term "diamond" refers to a carbon-based material which is almost always found in the crystalline form with a purely cubic orientation of sp$^3$ bonded carbon atoms, i.e., to a carbon-based material in which each carbon atom is covalently bonded to four other carbon atoms in a tetrahedron. Particular diamonds include polycrystalline diamonds, nanocrystalline diamonds, ultra nanocrystalline diamonds, and homoepitaxial single diamonds, each optionally doped by boron, nitrogen, hydrogen, phosphorus, or a combination thereof. In certain embodiments, the diamond is a homoepitaxial single crystal diamond, particularly an undoped homoepitaxial single crystal diamond type IIa.

The term "diamond-like carbon" as used herein refers to an amorphous carbon phase having sp$^3$ hybridized bonds as well as a certain amount of sp$^2$ hybridized bonds, more particularly, a material that has high sp$^3$ hybridized bonds content and displays some of the physical properties of diamond. Diamond-like carbons exist in seven different forms of amorphous carbon materials, all containing significant amounts of sp$^3$ hybridized carbon atoms. The different forms of diamond-like carbons may be produced by mixing the two crystalline polytypes of diamond, i.e., the one having a cubic lattice and the other rare one having a hexagonal lattice, in various ways at the nanoscale level of structure, and these materials may therefore be at the same time amorphous, flexible, and yet purely sp$^3$ bonded "diamond". The hardest, strongest, and slickest mixture is that known as tetrahedral amorphous carbon, or ta-C, considered to be the "pure" form of diamond-like carbon, as it consists of sp$^3$ bonded carbon atoms only. Diamond-like carbons close enough to ta-C on plots of bonding ratios and hydrogen content can be insulators with high values of resistivity. The term "insulating diamond-like carbon" as used herein thus refers to a diamond-like carbon having about 50% or more, e.g., about 50%, 55%, 60%, 65%, 70% 75%, 80%, 85%, 90%, 95% or more, sp$^3$ hybridized bonds. It should be noted that where particular values are described in the description and claims, unless otherwise stated, the term "about" means that an acceptable error range, e.g., up to 5% or 10%, for the particular value should be assumed.

In a particular such aspect, the present invention provides a conducting material comprising a diamond having a hydrogen-terminated surface and a layer of MoO$_3$ coating said surface, wherein said diamond may be a polycrystalline diamond, nanocrystalline diamond, ultra nanocrystalline diamond, or homoepitaxial single diamond, undoped or doped by boron, nitrogen, hydrogen, phosphorus, or a combination thereof, e.g., an undoped homoepitaxial single crystal diamond type IIa.

In certain embodiments, the MoO$_3$ layer coating the hydrogen-terminated surface of the carbon based material is a single-layer or a multi-layer of MoO$_3$ having a thickness in a range of 0.1 nm to 40 nm, e.g., 0.1 nm to 1 nm, 1 nm to 10 nm, 10 nm to 20 nm, 20 nm to 30 nm, 30 nm to 40 nm, 0.1 nm to 10 nm, 1 nm to 20 nm, 10 nm to 30 nm, or 20 nm to 40 nm.

In particular such embodiments, the carbon based material composing the conducting material of the present invention is a diamond, in any one of the forms listed above, and the thickness of the MoO$_3$ layer coating the hydrogen-terminated surface of the diamond is in a range of 0.1 nm to 40 nm, e.g., in a range of 1 nm to 10 nm. In more particular such embodiments, the conducting material of the invention has a sheet conductance higher than $1\times10^{-6}\Omega^{-1}$, e.g., in a range of $5.3\times10^{-4}\Omega^{-1}$ to $6.5\times10^{-4}\Omega^{-1}$, and a hole carrier concentration higher than $1\times10^{13}$ cm$^{-2}$, e.g., in a range of $7\times10^{13}$ cm$^{-2}$ to $2\times10^{14}$ cm$^{-2}$.

In another aspect, the present invention relates to an electronic component comprising a conducting material as defined above, i.e., a conducting material comprising a carbon based material having a hydrogen-terminated surface and a layer of MoO$_3$ coating said surface. In certain embodiments, the electronic component of the invention comprises a conducting material wherein the carbon based material is a diamond in any one of the forms listed above, and the thickness of the MoO$_3$ layer coating the hydrogen-terminated surface of the diamond is in a range of 0.1 nm to 40 nm, e.g., 1 nm to 10 nm. More particular such electronic components are those wherein said conducting material has a sheet conductance higher than $1\times10^{-6}\Omega^{-1}$ and a hole carrier concentration higher than $1\times10^{13}$ cm$^{-2}$.

In still another aspect, the present invention relates to an electrode comprising a conducting material as defined above, i.e., a conducting material comprising a carbon based material having a hydrogen-terminated surface and a layer of MoO$_3$ coating said surface. In certain embodiments, the electrode of the invention comprises a conducting material wherein the carbon based material is a diamond in any one of the forms listed above, and the thickness of the MoO$_3$ layer coating the hydrogen-terminated surface of the diamond is in a range of 0.1 nm to 40 nm, e.g., 1 nm to 10 nm. More particular such electrodes are those wherein said conducting material has a sheet conductance higher than $1\times10^{-6}\Omega^{-1}$ and a hole carrier concentration higher than $1\times10^{13}$ cm$^{-2}$. According to the invention, the electrode may comprise said conducting material as a conductive layer only or, alternatively, may entirely consist of said conducting material.

In yet another aspect, the present invention relates to a sensor comprising a conducting material as defined above, i.e., a conducting material comprising a carbon based material having a hydrogen-terminated surface and a layer of $MoO_3$ coating said surface. In certain embodiments, the sensor of the invention comprises a conducting material wherein the carbon based material is a diamond in any one of the forms listed above, and the thickness of the $MoO_3$ layer coating the hydrogen-terminated surface of the diamond is in a range of 0.1 nm to 40 nm, e.g., 1 nm to 10 nm. More particular such sensors are those wherein said conducting material has a sheet conductance higher than $1\times10^{-6}\Omega^{-1}$ and a hole carrier concentration higher than $1\times10^{13}$ $cm^{-2}$.

The sensor of the invention may be used, inter alia, for the detection of chemical or biological materials. In still other aspects, the present invention thus relates to the use of such a sensor for the detection of a chemical or biological material; and to a method for the detection of a chemical or biological material utilizing such a sensor.

A diode is a two-terminal electronic component with an asymmetric transfer characteristic, with low (ideally zero) resistance to current flow in one direction, and high (ideally infinite) resistance in the other. A semiconductor diode, the most common type today, is a crystalline piece of semiconductor material with a p-n junction connected to two electrical terminals. A p-n junction is a boundary or interface between two types of semiconductor material, p-type (a doped semiconductor containing excess holes) and n-type (doped semiconductor containing excess free electrons), inside a single crystal of semiconductor, created by doping, e.g., by ion implantation, diffusion of dopants, or by epitaxy, i.e., growing a layer of crystal doped with one type of dopant on top of a layer of crystal doped with another type of dopant. P-n junctions are elementary "building blocks" of most semiconductor electronic devices such as diodes, transistors, light-emitting diodes (LEDs) and integrated circuits, and are the active sites where the electronic action of the device takes place. Certain electronic devices such as particular types of transistors, e.g., bipolar junction transistors, consist of two p-n junctions in series, in the form of n-p-n or p-n-p junction or heterojunction.

In another aspect, the present invention relates to a diode comprising a conducting material as defined above, i.e., a conducting material comprising a carbon based material having a hydrogen-terminated surface and a layer of $MoO_3$ coating said surface. In certain embodiments, the diode of the invention comprises a conducting material wherein the carbon based material is a diamond in any one of the forms listed above, and the thickness of the $MoO_3$ layer coating the hydrogen-terminated surface of the diamond is in a range of 0.1 nm to 40 nm, e.g., 1 nm to 10 nm. More particular such diodes are those wherein said conducting material has a sheet conductance higher than $1\times10^{-6}\Omega^{-1}$ and a hole carrier concentration higher than $1\times10^{13}$ $cm^{-2}$.

In certain embodiments, the diode of the invention is a p-n junction diode, a p-n-p heterojunction diode, or n-p-n heterojunction diode, wherein one or more of the p-type layers in said diode comprises said conducting material and/or said conducting material bridges said p-n junction, p-n-p heterojunction or n-p-n heterojunction.

In other embodiments, the diode of the invention is configured as Schottky diode, also known as hot carrier diode, in which a metal-semiconductor rather than a semiconductor-semiconductor junction is formed, creating a Schottky barrier, i.e., as a semiconductor diode with a low forward voltage drop and a very fast switching action.

Field effect transistor (FET) is a unipolar transistor using an electric field to control the shape and hence the conductivity of a channel of one type of charge carrier in a semiconductor material. The device consists of an active channel through which charge carriers, electrons or holes, flow from the source, through which the carriers enter the channel, to the drain, through which the carriers leave the channel, wherein the conductivity of the channel is a function of the potential applied across the gate terminal, i.e., the terminal that modulates the channel conductivity, and source terminal. A FET can be constructed from a number of semiconductors, wherein the channel is doped to produce either an n-type or a p-type semiconductor, and the drain and source are each doped of similar or opposite type to the channel, depending on the mode of the FET.

In still another aspect, the present invention relates to a FET comprising a conducting material as defined above, i.e., a conducting material comprising a carbon based material having a hydrogen-terminated surface and a layer of $MoO_3$ coating said surface. In certain embodiments, the FET of the invention comprises a conducting material wherein the carbon based material is a diamond in any one of the forms listed above, and the thickness of the $MoO_3$ layer coating the hydrogen-terminated surface of the diamond is in a range of 0.1 nm to 40 nm, e.g., 1 nm to 10 nm. More particular such FETs are those wherein said conducting material has a sheet conductance higher than $1\times10^{-6}\Omega^{-1}$ and a hole carrier concentration higher than $1\times10^{13}$ $cm^{-2}$. The FET of the invention may comprise said conducting material as a conducting layer and/or as a p-type layer. In one particular embodiment, the FET of the invention is constructed as a high-frequency high power FET.

Field emission, also known as field electron emission and electron field emission, is emission of electrons induced by an electrostatic field, e.g., from a solid surface such as pure metals into vacuum, air, a fluid, or any non-conducting or weakly conducting dielectric. Field emission is explained by quantum tunneling of electrons, wherein the wave-mechanical tunneling of electrons through a rounded triangular barrier created at the surface of an electron conductor by applying a very high electric field is known as Fowler-Nordheim tunneling. Individual electrons can escape by Fowler-Nordheim tunneling from many materials in various different circumstances. Cold field electron emission is a particular statistical emission regime, in which the electrons in the emitter are initially in internal thermodynamic equilibrium, and most emitted electrons escape by Fowler-Nordheim tunneling from electron states close to the emitter Fermi level, i.e., electrochemical potential.

Cold cathodes are cathodes, i.e., electrodes emitting electrons, which in contrast to hot cathodes, are electrically heated to their operating temperature by methods other than electric current passing through a filament.

In yet another aspect, the present invention relates to a field emission electron source, e.g., a field emission cold cathode, comprising a conducting material as defined above, i.e., a conducting material comprising a carbon based material having a hydrogen-terminated surface and a layer of $MoO_3$ coating said surface. In certain embodiments, the field emission electron source of the invention comprises a conducting material wherein the carbon based material is a diamond in any one of the forms listed above, and the thickness of the $MoO_3$ layer coating the hydrogen-terminated surface of the diamond is in a range of 0.1 nm to 40 nm, e.g., 1 nm to 10 nm. More particular such field emission electron sources are those wherein said conducting material has a sheet conductance higher than $1\times10^{-6}\Omega^{-1}$ and a hole carrier concentration higher than $1\times10^{13}$ cm$^{-2}$.

In a further aspect, the present invention provides a method for molybdenum trioxide ($MoO_3$) deposition on a hydrogen-terminated surface of a carbon-based material selected from the group consisting of a diamond or insulating diamond-like carbon, said method comprising: (i) introducing said carbon-based material having a hydrogen-terminated surface into a vacuum chamber; (ii) heating said carbon-based material to a temperature in a range of 100° C. to 500° C., thereby removing hydrocarbon contaminants, desorbing water adsorbates from said carbon-based material and preparing surface conditions for optimal deposition; (iii) exposing the hydrogen-terminated surface of said carbon-based material to $MoO_3$ vapors thereby depositing a layer of $MoO_3$ on the hydrogen-terminated surface of said carbon-based material; and (iv) repeating steps (ii) and (iii) until a desired thickness of said $MoO_3$ layer is obtained.

According to the method of the invention, the hydrogen-terminated surface of the carbon based material introduced in step (i) may be obtained by any method or technology known in the art, e.g., by exposing a surface of a diamond or a diamond-like carbon first to pure hydrogen plasma in a chemical vapor deposition (CVD) reactor, e.g., at a temperature in a range of 450° C. to 1150° C., and then to humid air, as exemplified herein. Once obtained, the carbon based material is heated in step (ii) to a temperature in a range of 100° C. to 500° C., e.g., to about 100° C., 150° C., 200° C., 250° C., 300° C., 350° C., 400° C., 450° C. or 500° C., so as to remove hydrocarbon contaminants and desorb water adsorbates therefrom. The deposition of $MoO_3$ on the treated hydrogen-terminated surface in step (iii) is carried out by exposing said surface to $MoO_3$ vapors. In certain embodiments, this process is conducted at room temperature, with a deposition rate in a range of 0.05 nm/min to 5 nm/min, e.g., with a deposition rate of 0.1, 0.2, 0.3, 0.4, 0.5, 0.6, 0.7, 0.8. 0.9 or 1.0 nm/min.

In order to obtain particular thicknesses of $MoO_3$ layers, different deposition rates may be used in step (iii) of the method. In addition, in order to obtain a multi-layer of $MoO_3$ coating the hydrogen-terminated surface of the carbon based material, the deposition step (iii) may be repeated more than once, provided that prior to each deposition, the sample treated is heated in situ as defined above, e.g., for 60 minutes, for sample annealing and so as to remove hydrocarbon contaminants and desorb any water-adsorbates inducing surface conductivity from the samples during ambient exposure. The deposited $MoO_3$ thicknesses values may be confirmed by any suitable technology, e.g., by Rutherford Backscattering spectrometry (RBS) as exemplified herein.

The invention will now be illustrated by the following non-limiting Examples.

EXAMPLES

Experimental

Un-doped type IIa (100) diamond single crystal samples were used. Surface treatment of the samples included cleaning in boiling acids and hydrogen termination by exposure to pure hydrogen plasma in a chemical vapor deposition (CVD) reactor at temperature of above 650° C. for 40 minutes. The samples were then introduced to a vacuum chamber ($10^{-7}$ torr) for $MoO_3$ thermal deposition of various thicknesses: 1 nm, 3 nm, 5 nm, 7 nm, 10 nm and 40 nm. Prior to each deposition, the hydrogenated diamond samples were heated in situ to 350° C. for 60 minutes through an underlying heater, to remove hydrocarbon contaminants and to desorb water-adsorbate inducing surface conductivity during ambient exposure. $MoO_3$ was evaporated in situ from a Knudsen cell onto the samples surface at room temperature with a deposition rate of 0.1 nm/min, nominally determined by a quartz crystal microbalance. The deposited $MoO_3$ thicknesses values were confirmed by Rutherford Backscattering spectrometry (RBS). After $MoO_3$ deposition, al samples were kept and manipulated in ambient air conditions. Electrical measurements consisting of carrier type, carrier concentration, and mobility were performed as function of temperature, from −200° C. to 350° C., using Hall Effect measurements in the Van der Pauw configuration. Four silver paint points, placed on the top layer of the samples as previously reported (Yom-Tov et al., 2010) were used for the electrical contacts. X-ray photoelectron spectroscopy (XPS) measurements were used to characterize the chemical bonding and to determine the band structure of the films. These measurements were conducted in a Thermo VG Scientific Sigma Probe system using a monochromatic Al Kα (1486.6 eV) x-ray source in bulk and surface modes (including grazing angle emission 63°-83°). Mo 3d and C 1s core levels spectra were collected with pass energy of 20 eV. The spectrometer binding energies (BE) were calibrated by setting the $4f_{7/2}$ core level of Au to 84.0 eV and also correcting the position of the substrate Mo $3d_{5/2}$ $Mo^{6+}$ oxide state line to 232.6 eV (Choi and Thompson, 1996) as a precaution against drift and charging effects. Curve fitting was done by the XPSPEAK 4.1 software using Voigt functions convolution with a Shirley-type background subtraction.

Example 1

$MoO_3$-Coated Hydrogen Terminated Diamond Surface is a Strong Conductor Showing Robust Stability Hydrogen terminated diamond samples were coated with thermally evaporated $MoO_3$ to thicknesses ranging from 5 to 100 Å after in-situ heating at 350° C. of the samples, to remove any humidity related conductivity (see experimental section). Their electrical properties were measured by Hall Effect in a Van der Pauw configuration as previously described (Yom-Tov et al., 2010). FIG. 1 shows a comparison of the areal hole density and conductance values, as a function of layer thickness, for different adsorbate layers inducing electrochemical TD of diamond:H (20,22,23) including the results of the present experiment for TD with MoO3. The data clearly demonstrate superior electrical properties obtained for $MoO_3$ layers evaporated onto diamond:H. The areal hole concentration values for the $MoO_3$ TD case monotonically increase from $7\times10^{13}$ to $1\times10^{14}$ cm$^{-2}$ with increasing thickness.

Figure 2A:
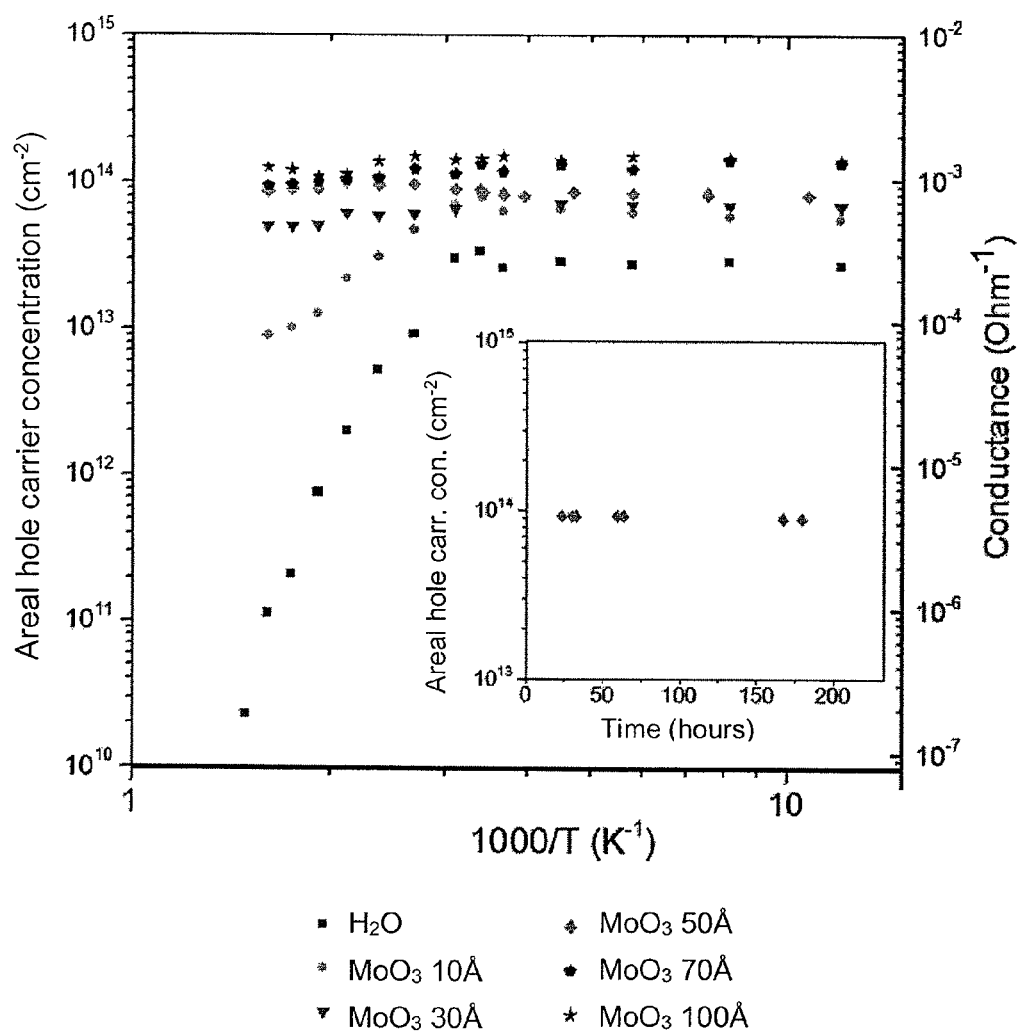
FIGS. 2A-2B show (2A) areal hole carrier concentration and sheet conductance of transfer doped hydrogen terminated diamond samples with $H_2O$ and $MoO_3$ at different thicknesses as a function of inverse temperature (1000/T); In the inset, repeated measurements of areal hole carrier concentration at room temperature of transfer doped hydrogen terminated diamond samples with MoO$_3$ (50 Å) are plotted showing no change over a period of several days (2A); and mobility of transfer doped hydrogen terminated diamond samples with H$_2$O and MoO$_3$ at different thicknesses as a function of inverse temperature (1000/T) (2B).

FIG. 2A shows the results of the hole sheet concentration deduced from Hall effect measurements as function of temperature between −200 to 350° C. (plotted as 1000/T) for air-exposed diamond:H/$MoO_3$ samples with different $MoO_3$ thicknesses. This Figure further shows, for comparison, the results of a similar experiment for a $H_2O$ transfer doped diamond:H. It should be noted that while the hole concentration values rapidly decrease (by more than 3 orders of magnitudes, from $3\times10^{13}$ to $2\times10^{10}$ cm$^{-2}$) from 50 to 400° C. for diamond:H/$H_2O$, due to water desorption (Laikhtman et al., 2004), the diamond:H/$MoO_3$ samples show almost no changes for all measured temperatures, once the layer thickness exceeds 30 Å. The gradual decrease of the areal hole-concentration (for thickness less than 30 Å) is most likely due to non-uniform MoO$_3$ coverage of the diamond:H surface, leaving some bare diamond:H to be subjected to TD by atmospheric H$_2$O. In this case increasing the temperature (from 50° C. to 350° C.), causes a gradual desorption of the fractional water coverage resulting in a moderate loss of conductance. Samples with higher MoO$_3$ thicknesses, (above 30 Å), exhibit thermal stability of the sheet hole carrier concentration up to 350° C. suggesting that full coverage of the diamond:H surface has been achieved. Repeated measurements over a period of several days showed no change in the electrical properties as shown in the inset of FIG. 2A; that is, the properties of the transfer doped layers are stable with time. The above indicates that exposure of the MoO$_3$ covered samples to atmosphere has a minimal influence to the electrical properties of the diamond:H/MoO$_3$ even for a minimal coverage as thin as 50 Å evidencing that additional MoO$_3$ capping layers seems to protect the initial MoO$_3$ layers involved in the transfer doping.

Figure 2B:
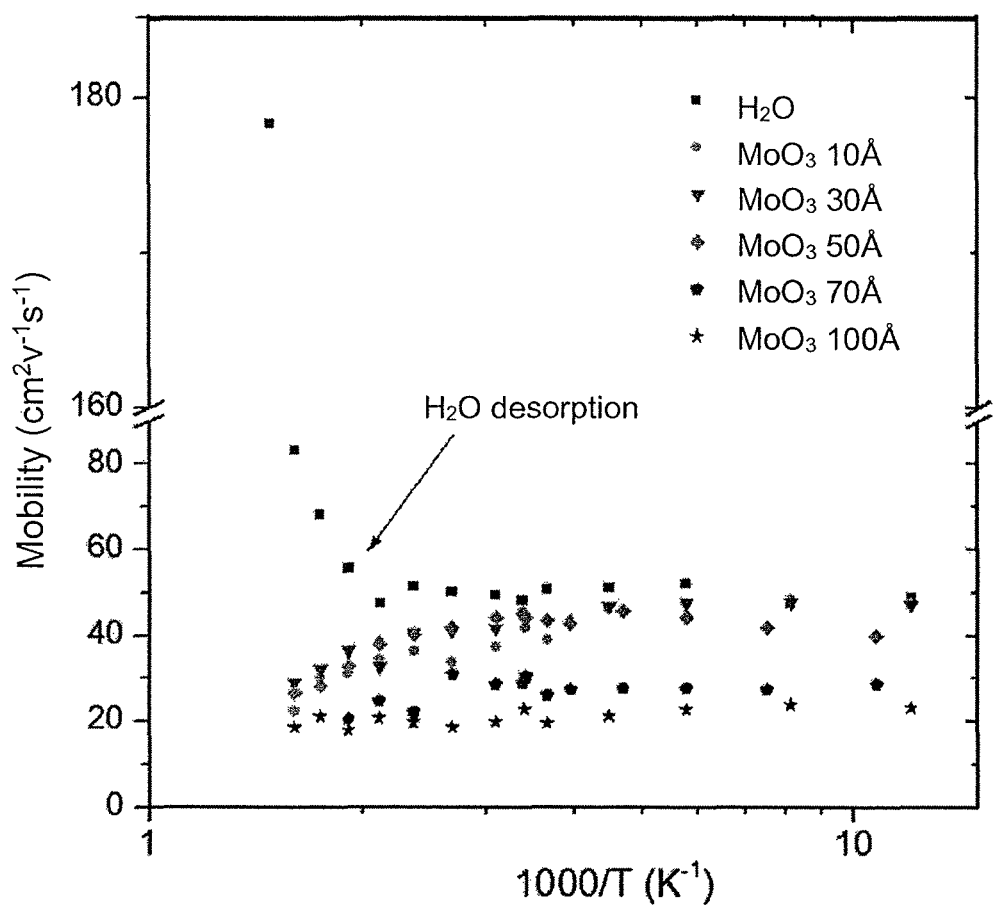

FIG. 2B shows the hole mobility ranges between 20-50 cm 2 V$^{-1}$ s$^{-1}$ obtained from Hall Effect measurements of the diamond:H/MoO$_3$ samples as function of temperature (1000/T). These values are comparable to the mobility values of the diamond:H/H$_2$O sample at room temperature before H$_2$O desorption. The mobility remains almost constant between temperatures −200 to 200° C., while an increase is noted above 250° C. once the water has totally been desorbed from the diamond:H surface. Up to this temperature (250° C.), the limiting factor of mobility seems to be the scattering of free carrier on neutral surface traps which is temperature independent.

As a control, a non-hydrogenated bare diamond has been coated with MoO$_3$ (30 Å) under similar conditions and its electrical properties were measured. The results showed a minimal change in the diamond/MoO$_3$ resistance from 10$^{12}$ Ohms at room temperature to 10$^{10}$ Ohms, at 350° C., with no possibility to measure Hall Effect due to currents below 100 pA, indicating that no parallel conduction occurs in the MoO$_3$ layer upon heating up to 350° C. Thus, excluding possible electrical conductivity effects originating from the non-transfer doped MoO$_3$ layer or by any other temperature driven process affecting electrical properties of the MoO$_3$. Hence electrical properties of MoO$_3$ TD diamond are stable up to at least 350° C.

Figure 3:
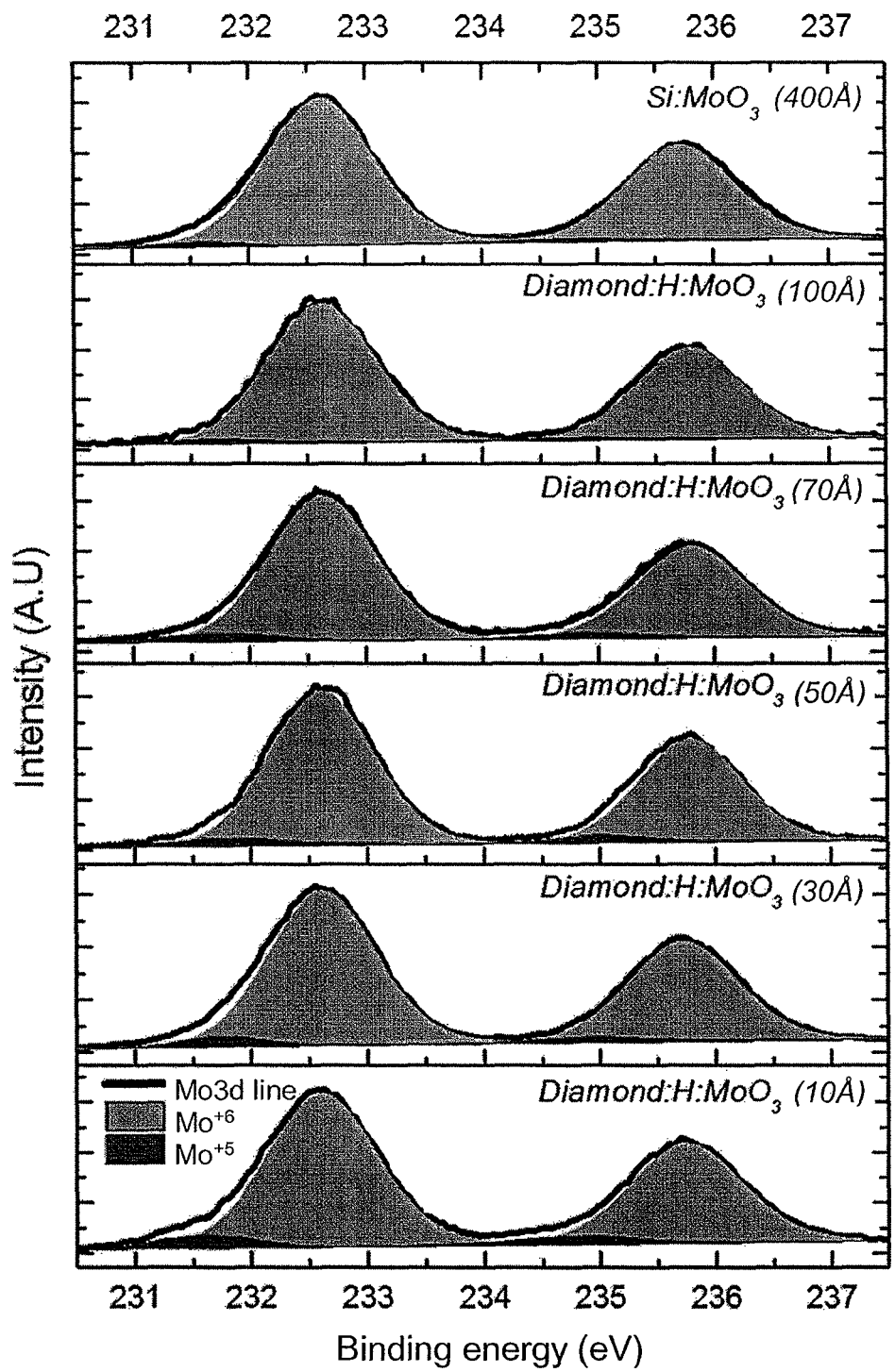
FIG. 3 shows Mo3d XPS spectra for MoO$_3$ films of various thicknesses (10 Å to 100 Å) deposited onto hydrogenated diamond and 400 Å deposited on Si. Mo$^{6+}$ and Mo$^{5+}$ oxidation states are presented as two different nuance of gray.

X-ray photoelectron spectroscopy (XPS) measurements of Mo3d and C1s core level spectra were carried out to characterize the chemical bonding and stoichiometry of the MoO$_3$, and to determine the band bending of the diamond:H/MoO$_3$ interface. XPS spectra of Mo3d, shown in FIG. 3, were used to determine the ratios of oxidations states for the different diamond:H/MoO$_3$ films and to exclude further reduction states. Also shown, as a reference, are the results of a thick MoO$_3$ layer of 400 Å deposited on Si. The 3d$_{5/2}$ and 3d$_{3/2}$ doublet peaks (with a splitting BE of 3.2 eV) are clearly noticeable. The Mo$^{6+}$ oxidation state (orange area) appears at a binding energy of 232.6 eV, and its reduction to the Mo$^{5+}$ state (purple area) appears at 231.7 eV (FIG. 3) as reported in literature (Choi and Thompson, 1996). It should be noted that the dominant Mo$^{6+}$ molybdenum oxidation state barely changes with thickness, and only a few percent (between 3-10%) of the Mo$^{5+}$ state are present in all samples.

Figure 4:
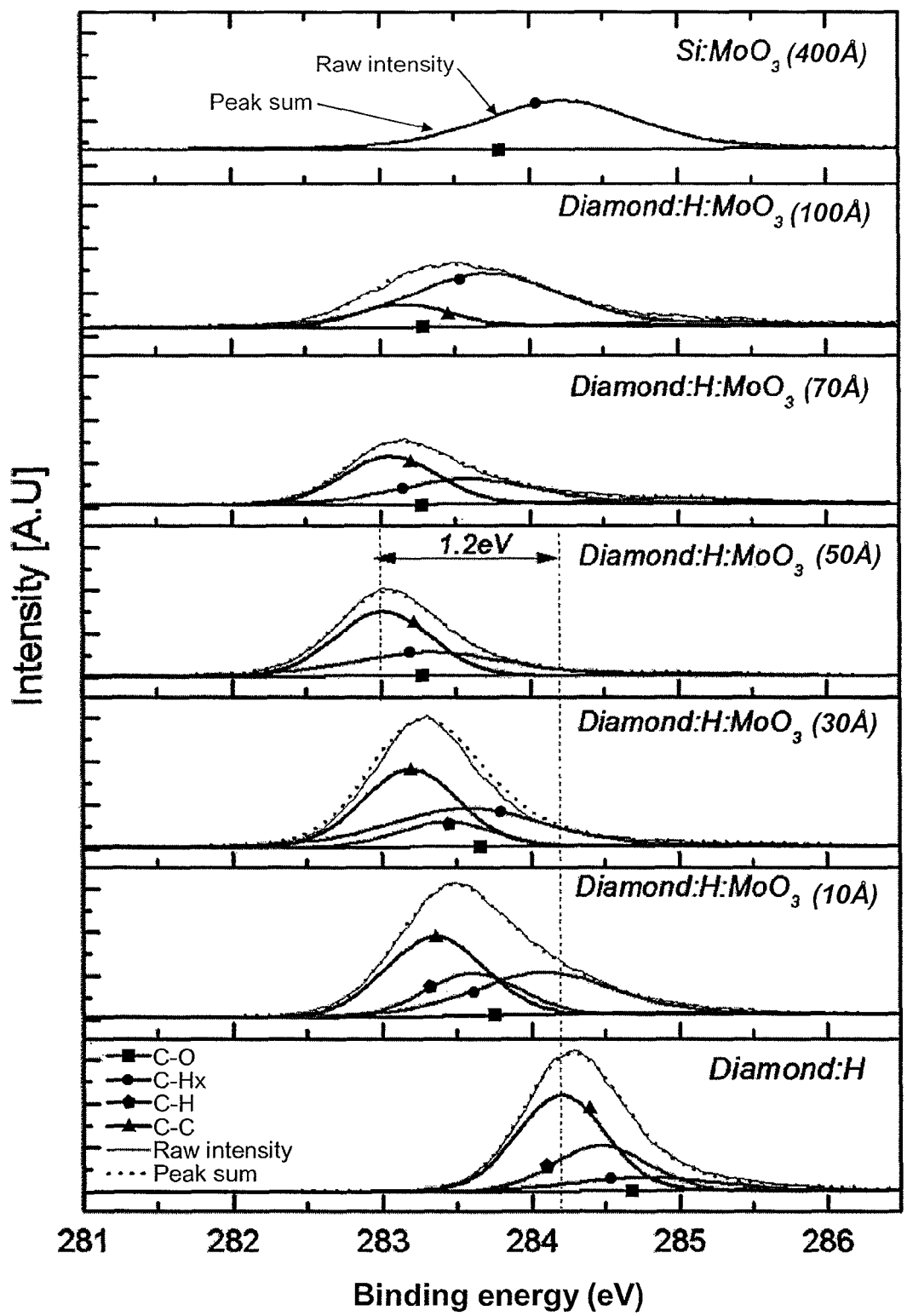
FIG. 4 shows C1s XPS spectra for MoO$_3$ films of various thicknesses (10 Å to 100 Å) deposited on hydrogenated diamond and 400 Å deposited on Si. Marked are: C—C bulk diamond component; the surface component C—H; a surface component contaminant hydrocarbon C—H$_x$; carboxyl weak feature C—O; sum of fitted peaks; and experimental data (almost overlapping).
Figure 5A:
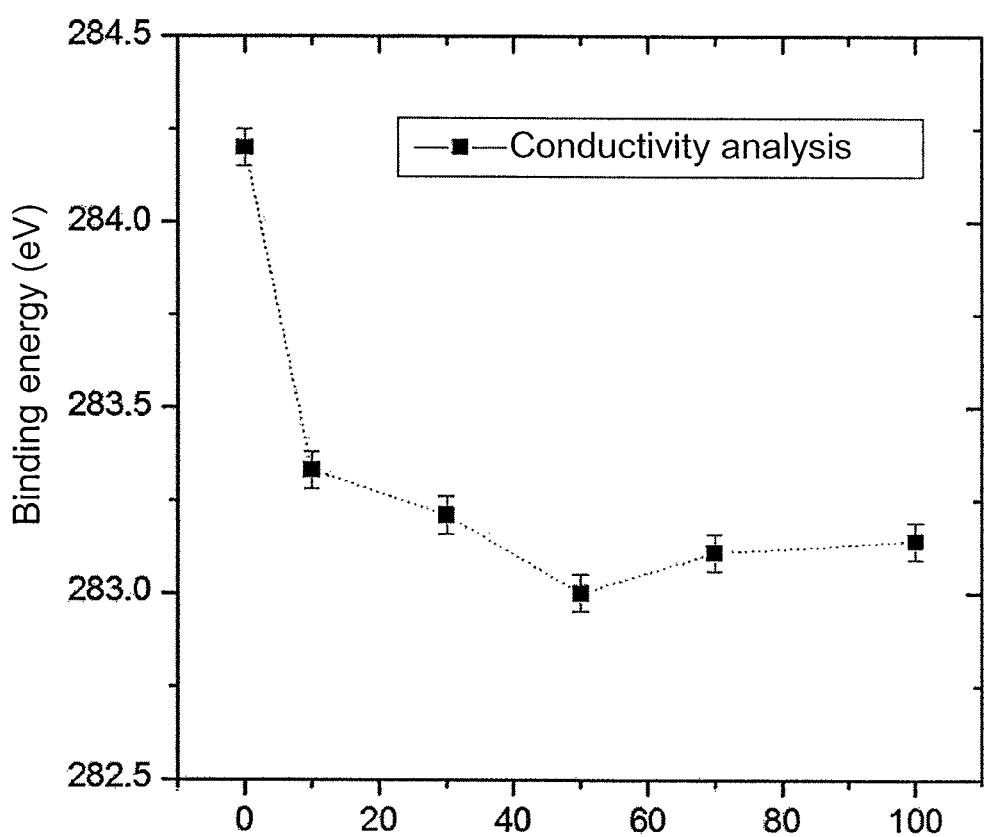
FIGS. 5A-5B show C1s diamond bulk binding energy position as a function of MoO$_3$ thickness coverage (5A); and variation of $E_F$–$E_{VBM}$ values as a function of MoO$_3$ thickness coverage derived from XPS measurement of C1s diamond bulk binding energy position and from Hall Effect measurement of areal hole carrier concentrations versus temperature (5B).

C1s core level spectra for the different MoO$_3$ thicknesses were measured by XPS in order to probe the state of the near surface C atoms and to estimate the position of the surface Fermi level (E$_F$) relative to the valence band maximum (E$_{VBM}$). FIG. 4 shows the results of C1s core level peaks, with their de-convoluted bonding components for diamond:H covered with MoO$_3$ at increasing thicknesses and, as a reference, for a type IIb boron doped diamond:H after annealing at 400° C. (lowest curve). The various C1s lines arise from a pure bulk diamond component (blue line) at a binding energy (BE) of 284.2 eV, a surface component C—H (green line) chemically shifted to a higher binding energy by 0.25 eV, hydrocarbons contaminants surface component (C—H$_x$ orange line) shifted to higher binding energies by 0.58 eV and a weak carboxyl (C—O pink line) feature is barely noticeable. The presence of hydrocarbons (C—H$_x$), presumably originating from MoO$_3$ surface contaminants, becomes significant with the increasing MoO$_3$ coverage. Most importantly a shift of the diamond bulk peak position with increasing MoO$_3$ thickness is apparent. The position of the bulk diamond peak binding energy is plotted in FIG. 5A as a function of MoO$_3$ layer thickness indicating a maximum shift of 1.2 eV from the bulk VBM position at about 50 Å.

Figure 5B:
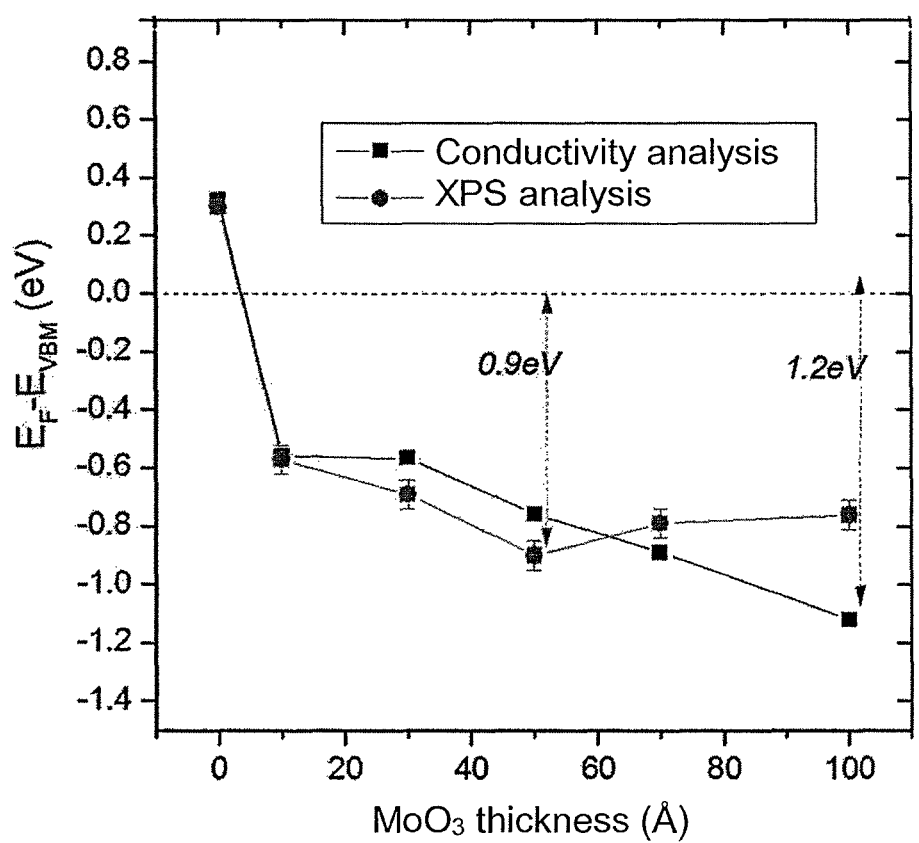
Figure 6:
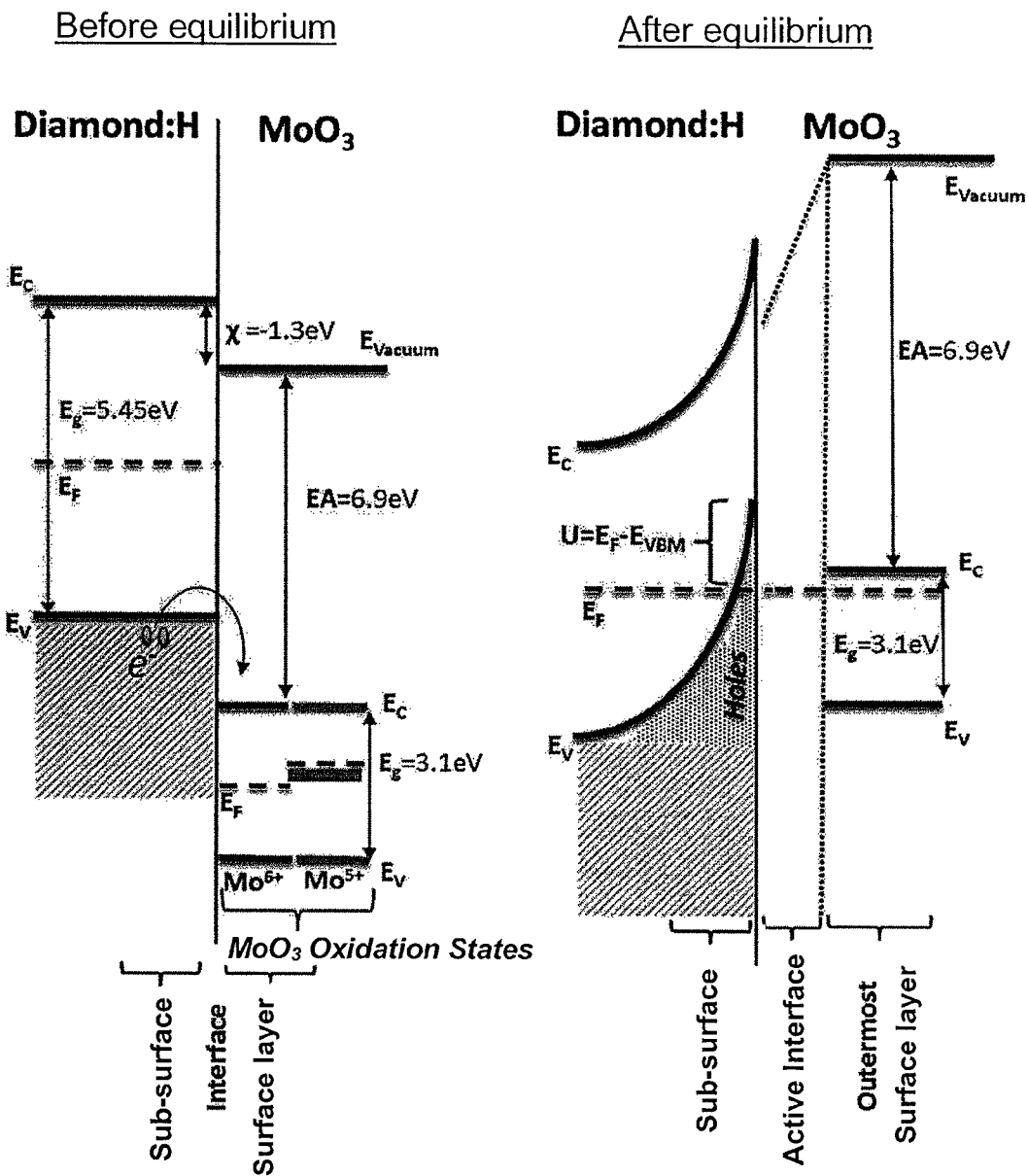
FIG. 6 shows schematic presentation of energy-level diagram before charge exchange (left) and after equilibrium (right) of the surface transfer doping of hydrogenated diamond with MoO$_3$.

The band bending (BB), E$_F$−E$_{VBM}$ (schematically represented in FIG. 6) was determined as the energy difference between the diamond bulk peak, extracted from the measured C1s binding energy (FIG. 5A), and the known fixed energy separation of the VBM to the C1s core level of 283.9±0.1 eV (Maier et al., 2001). The dependence of E$_F$−E$_{VBM}$ on MoO$_3$ thickness is shown in FIG. 5B. The EVBM value starts from a position below the bulk Fermi level (0.35 eV), in accord with other reports (Edmonds et al., 2011) and rises rapidly, reaching a maximum (0.9 eV) above the Fermi level for a MoO$_3$ thickness of 50 Å whereupon saturation is noted.

The band bending can also be deduced from results of the areal hole density versus temperature for the different diamond:H/MoO$_3$ samples as measured by Hall Effect. The surface potential value, u=E$_{VBM}$−E$_F$ (note that u=−(E$_F$−E$_{VBM}$) as determined from XPS), can be numerically extracted from the areal hole density expression (Ristein, 2006) p(u), (see Equation (1) by using the Poisson equation related to the degenerate case for high hole densities (in which Fermi level is located inside the VBM):

$$p(u) = N_v \sqrt{2kT\varepsilon\varepsilon_o/e^2 N_v} \cdot \sqrt{1 + \frac{u}{kT} + \frac{8}{15\sqrt{\pi}}\left(\frac{u}{kT}\right)^{5/2}} \quad (1)$$

For u > 0

With N$_v$=2.7×10$^{19}$ cm$^{-3}$ being the effective density of state at room temperature, T the temperature, k the Boltzmann's constant, e the dielectric constant and $\varepsilon_o$ the vacuum permeability.

By inserting the measured areal hole concentrations for different temperatures in Equation (1), the surface potential values, u=E$_{VBM}$−E$_F$ were deduced. These are compared to the results of the BB obtained from the XPS measurements of the C1s core level shifts in FIG. 5B. According to the XPS results, the BB values with respect to E$_F$ reach a maximum of 0.9 eV corresponding to the areal hole density of 8×10$^{13}$ cm$^{-2}$ for a 50 Å thick diamond:H/MoO$_3$ sample. In contrast, the BB values deduced from the electrical measurements keep increasing, reaching a value of 1.2 eV, corresponding to the areal hole density of 1×10$^{14}$ cm$^{-2}$ for a 100 Å thick diamond:H/MoO$_3$ sample. The results obtained from both methods are in agreement for MoO$_3$ thicknesses up to 70 Å, whereas deviations in E$_F$−E$_{VBM}$ values between the two methods are noticed for thicker layers. This reflects the limited depth sensitivity of the XPS method to the C1s diamond bulk BE signal from the diamond:H/MoO$_3$ interface. Hence the BB cannot be reliably evaluated from the XPS results for samples thicker than 70 Å, whereas the results deduced from the conductivity measurements are relatively trustworthy for all MoO$_3$ thicknesses.

The present experimental results can be compared with theoretical simulations based on self-consistent solution of Schrodinger-Poisson's model for the hole sheet density in subsurface hole gas, as done by Edmonds et al. (2011). These calculations predict the BB values as a function of areal hole densities separately for the cases of heavy-holes, light-holes and split-off bands in diamond. The extracted BB value for each sub-band yields a value of ≈1.28 eV, corresponding to areal hole densities close to 1×10$^{14}$ cm$^{-2}$ while the result for the single-band model, unified bands, (taking account 2D density of state effective mass assumptions) yields BB values higher than 1.3 eV. The present experimental results, in which the measured BB values were found to be in the range of 0.9-1.2 eV, respectively corresponding to a hole sheet density in the range of 7×1013-1×1014 cm$^{-2}$, agree well with the simulation results done for light holes, heavy holes and the split off band model computations (Edmonds et al., 2011). It should be noted that the maximum measured value of areal hole density (5×10$^{13}$ cm$^{-2}$) reported so far (Sauerer et al., 2001), yielding surface electric field values of 0.4-2×10$^7$ V cm$^{-1}$, is close to the published value for the breakdown field in diamond (Geis, 1991). The present results lead to a surface electric field range of 1.5-3×10$^7$ V cm$^{-1}$, somewhat exceeding the up till now accepted value for breakdown field.

REFERENCES

Bolker, A., Saguy, C., Tordjman, M., Gan, L., Kalish, R., *Phys. Rev. B.*, 2011, 83, 155434

Chakrapani, V., Angus, J. C., Anderson, A. B., Wolter, S. D., Stoner, B. R., Sumanasekera, G. U., *Science*, 2007, 318, 1424

Chen, W., Qi, D., Gao, Xingyu, Wee, A. T. S., *Progress in Surface Science*, 2009, 84, 279-321

Choi, S. G., Thompson, L. T., *Appl. Surf. Sci.*, 1996, 93, 143

Christiaens, P., Vermeeren, V., Wenmackers, S., Daenen, M., Haenen, K., Nesládek, M., vandeVen, M., Ameloot, M., Michiels, L., Wagner, P., *Biosens. Bioelectron.*, 2006, 22, 170

Dankerl, M., Lipert, A., Briner, S., Stutzel, E. U., Stutzmann, M., Garrido, J. A., *Phys. Rev. Lett.*, 2011, 106, 196103

Edmonds, M. T., Pakes, C. I., Mammadov, S., Zhang, W., Tadich, A., Ristein, J., Ley, L., *Phys. Status Solidi A*, 2011, 208, 9

Geis, M., *Proc. IEEE*, 1991, 79, 669

Geisler, M., Hugel, T., *Adv. Mater.*, 2010, 22, 398-402

Isberg, J., Hammersberg, J., Johansson, E., Wikstrom, T., Twitchen, D. J., Whitehead, A. Coe, S. E., Scarsbrook, G. A., *Science*, 2002, 297, 5587, 1670-1672

Kasu, M., Ueda, K., Ye, H., Yamauchi, Y., Sasaki, S., Makimoto, T., *Electron. Lett.*, 2005, 41, 22, 1248

Laikhtman, A., Lafosse, A., Le Coata, Y., Azriaa, R., Hoffman, A., *Surf. Sci.*, 2004, 551, 99-105

Landstrass, M. I., Ravi, K. V., *Appl. Phys. Lett.*, 1989, 55, 975

Lud, S. Q., Steenackers, M., Jordan, R., Bruno, P., Gruen, D. M., Feulner, P., Garrido, J. A., Stutzmann, M., *J. Am. Chem. Soc.*, 2006, 128, 16884

Maier, F., Riedel, M., Mantel, B., Ristein, J., Ley, L., *Phys. Rev. Lett.*, 2000, 85, 3472-3475

Maier, F., Ristein, J., Ley, L., *Phys. Rev. B*, 2001, 64, 165411

Poh, W. C., Loh, K. P., Zhang, W. D., Tripathy, S., Ye, J. S., Sheu, F. S., *Langmuir*, 2004, 20, 5484

Qi, D., Chen, W., Gao, X., Wang, L., Chen, S., Loh, K. P., Wee, A. T. S., *J. Am. Chem. Soc.*, 2007, 129, 8084-8085

Ristein, J., Riedel, M., Ley, L., *J. Electrochem. Soc.*, 2004, 151, 10

Ristein, J., *J. Phys. D: Appl. Phys.*, 2006, 39, R71-R81

Russell, S. A. O., Sharabi, S., Tallaire, A., Moran, D. A. J., *IEEE Electron Device Letters*, 2012, 33, 10, 1471-1473

Russell, S. A. O., Cao, L., Qi, D., Tallaire, A., Crawford, K. G., Wee, A. T. S., Moran, D. A. J., *Appl. Phys. Lett.*, 2013, 113, 202112

Sauerer, C., Ertl, F., Nebel, C. E., Stutzmann, M., Bergonzo, P., Williams, O. A., Jackman, R. A., *Phys. Status Solidi A*, 2001, 186, 241

Strobel, P., Riedel, M., Ristein, J., Ley, L., *Nature*, 2004, 430, 439-441

Strobel, P., Ristein, J., Ley L., Seppelt, K., Goldt, I. V., Boltalina, O., *Diamond and Related Materials*, 2006, 15, 720

Sussmann, R. S., *CVD Diamond for Electronic Devices*, John Wiley & Sons, Chichester, 2009

Taniuchi, H., Umezawa, H., Arima, T., Tachiki, M., Kawarada, H., *IEEE Electron. Dev. Lett.*, 2001, 22, 8, 390

Wort, C. J. H., Balmer, R. S., *Mater. Toda.*, 2008, 11, 1/2, 22-28

Yang, W., Auciello, O., Butler, J. E., Cai, W., Carlisle, J. A., Gerbi, J. E., Gruen, D. M., Knickerbocker, T., Lasseter, T. L., Russell Jr. J. N., Smith, L. M., Hamers, R. J., *Nat. Mater.*, 2002, 1, 253

Yom-Tov, N., Saguy, C., Bolker, A., Kalish, R., Yaish, Y. E., *J. Appl. Phys.*, 2010, 108, 043711

The invention claimed is:

1. A conducting material comprising a carbon-based material selected from the group consisting of a diamond or insulating diamond-like carbon, having a hydrogen-terminated surface and a layer of molybdenum trioxide (MoO$_3$) coating said hydrogen-terminated surface.

2. The conducting material of claim 1, wherein said diamond is polycrystalline diamond, nanocrystalline diamond, ultra nanocrystalline diamond, or single diamond.

3. The conducting material of claim 1, wherein said MoO$_3$ layer is a single- or multi-layer of MoO$_3$ having a thickness in a range of 0.1 nm to 40 nm.

4. The conducting material of claim 1, wherein said carbon based material is diamond and the thickness of said MoO$_3$ layer is in a range of 0.1 nm to 40 nm.

5. The conducting material of claim 4, having a sheet conductance higher than 1×10$^{-6}$Ω$^{-1}$, and a hole carrier concentration higher than 1×10$^{13}$ cm$^{-2}$.

6. The conducting material of claim 5, having a sheet conductance in a range of 5.3×10$^{-4}$ Ω$^{-1}$ to 6.5×10$^{-4}$Ω$^{-1}$, and a hole carrier concentration in a range of 7×10$^{13}$ cm$^{-2}$ to 2×10$^{14}$ cm$^{-2}$.

7. An electronic component comprising a conducting material according to claim 1.

8. An electrode comprising a conducting material according to claim 1.

9. The electrode of claim 8, comprising said conducting material as a conductive layer.

10. A sensor comprising a conducting material according to claim 1.

11. In a method for detection of a chemical or biological material using a sensor, the improvement wherein said sensor comprises a conducting material according to claim 1.

12. A diode comprising a conducting material according to claim 1.

13. The diode of claim 12, comprising a p-n junction, a p-n-p heterojunction or n-p-n heterojunction, wherein one or more of the p-type layers comprises said conducting material and/or said conducting material bridges said p-n junction, p-n-p heterojunction or n-p-n heterojunction.

14. The diode of claim 12, configured as a schottky diode.

15. A field effect transistor (FET) comprising a conductive material according to claim 1 as either a conductive layer or a p-type layer.

16. The FET of claim 15, constructed as a high-frequency high power FET.

17. A field emission electron source comprising a conductive material according to claim 1.

18. A method for molybdenum trioxide ($MoO_3$) deposition on a hydrogen-terminated surface of a carbon-based material selected from the group consisting of a diamond or insulating diamond-like carbon, said method comprising:
   (i) introducing said carbon-based material having a hydrogen-terminated surface into a vacuum chamber;
   (ii) heating said carbon-based material to a temperature in a range of 100° C. to 500° C., thereby removing hydrocarbon contaminants, desorbing water adsorbates from said carbon-based material, and preparing surface conditions for optimal deposition;
   (iii) exposing the hydrogen-terminated surface of said carbon-based material to $MoO_3$ vapors thereby depositing a layer of $MoO_3$ on the hydrogen-terminated surface of said carbon-based material; and
   (iv) repeating steps (ii) and (iii) until a desired thickness of said $MoO_3$ layer is obtained.

19. The method of claim 18, wherein the hydrogen-terminated surface of said carbon-based material introduced in step (i) is obtained by exposing a surface of a diamond or insulating diamond-like carbon first to pure hydrogen plasma in a chemical vapor deposition (CVD) reactor at a temperature in a range of 450° C. to 1150° C., and then to humid air.

20. The method of claim 18, wherein the hydrogen-terminated surface of said carbon-based material is exposed to $MoO_3$ vapors in step (iii) at room temperature, with a deposition rate in a range of 0.05 nm/min to 5 nm/min.

21. The method of claim 20, wherein the hydrogen-terminated surface of said carbon-based material is exposed to $MoO_3$ vapors in step (iii) at room temperature, with a deposition rate of 0.1 nm/min.

* * * * *